United States Patent [19]

Nakamura

[11] Patent Number: 5,514,984
[45] Date of Patent: May 7, 1996

[54] ACTIVE PULL DOWN TYPE ECL APPARATUS CAPABLE OF STABLE OPERATION

[75] Inventor: Satoshi Nakamura, Tokyo, Japan

[73] Assignee: NEC Corporation, Tokyo, Japan

[21] Appl. No.: 324,500

[22] Filed: Oct. 18, 1994

[30] Foreign Application Priority Data

Oct. 20, 1993 [JP] Japan .................................. 5-286101

[51] Int. Cl.⁶ .............................................. H03K 19/013
[52] U.S. Cl. .............................. 326/126; 326/18; 326/127
[58] Field of Search ...................... 326/18, 126, 127–128

[56] References Cited

U.S. PATENT DOCUMENTS

| | | | |
|---|---|---|---|
| 5,089,725 | 2/1992 | Mollier et al. | 326/127 |
| 5,124,581 | 6/1992 | Umeki | 326/126 X |
| 5,146,116 | 9/1992 | Sugimoto | 326/126 |
| 5,177,379 | 1/1993 | Matsumoto | 326/126 |
| 5,216,296 | 6/1993 | Tsunoi et al. | 326/126 |
| 5,237,216 | 8/1993 | Hayano et al. | 326/126 |
| 5,298,802 | 3/1994 | Usami et al. | 326/126 |
| 5,321,321 | 6/1994 | Kurisu | 326/126 |
| 5,331,225 | 7/1994 | Matsui et al. | 326/126 X |
| 5,334,886 | 8/1994 | Chuang | 326/126 |

FOREIGN PATENT DOCUMENTS 3-106222  5/1991  Japan .

OTHER PUBLICATIONS

"A 23ps/2.1mW ECL Gate", Toh et al., IEEE International Solid-State Circuits Conference, pp. 224–225, 1989.

*Primary Examiner*—David R. Hudspeth
*Attorney, Agent, or Firm*—Popham, Haik, Schnobrich & Kaufman, Ltd.

[57] ABSTRACT

In an active pull down ECL apparatus including a current switch formed by an input transistor and a reference transistor, an emitter follower controlled by a collector voltage of the input transistor or the reference transistor, and an active pull down circuit connected to the emitter follower, a resistor is connected to an emitter of the input transistor or the reference transistor.

10 Claims, 9 Drawing Sheets

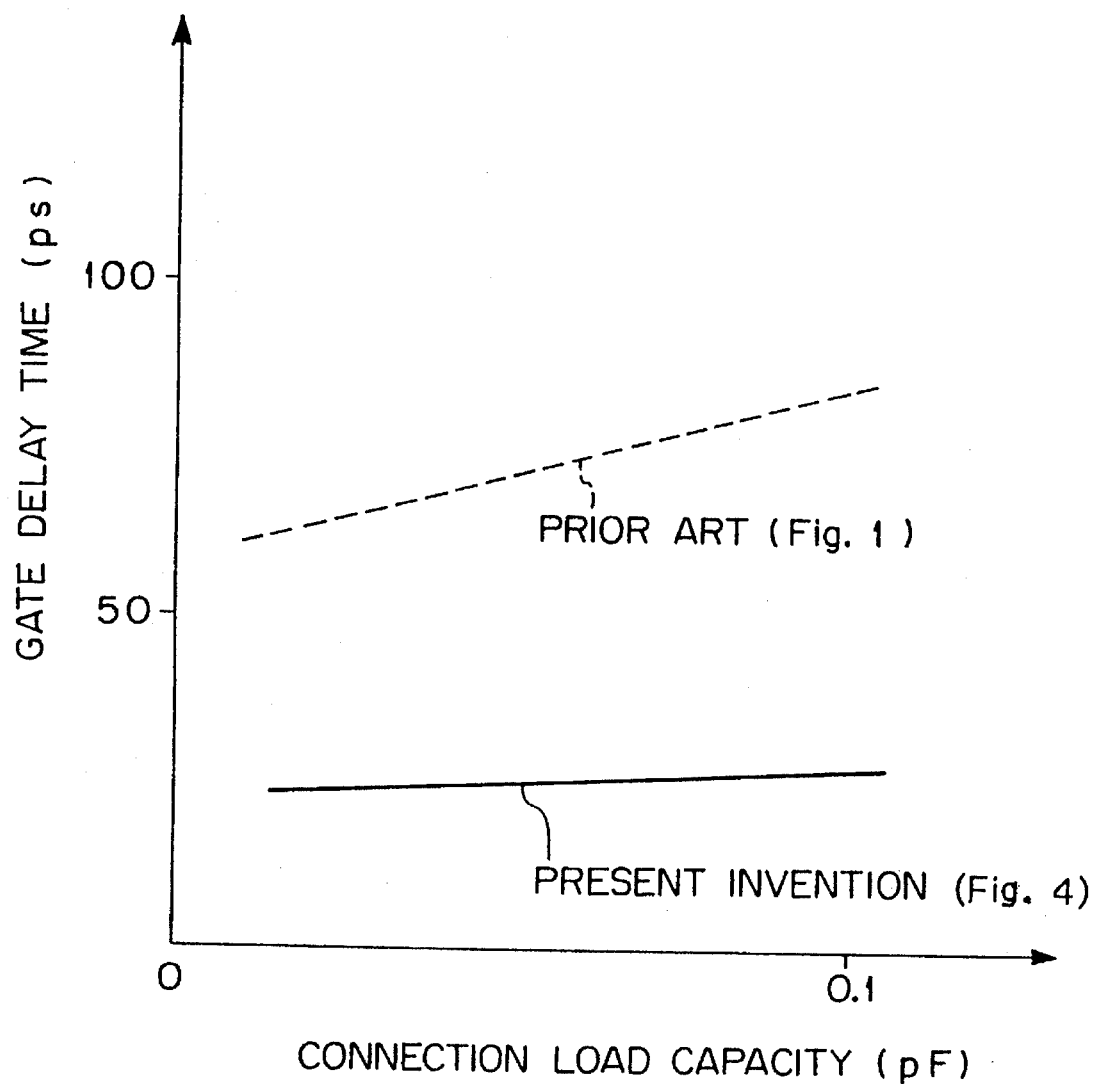

1

ACTIVE PULL DOWN TYPE ECL APPARATUS CAPABLE OF STABLE OPERATION

BACKGROUND OF THE INVENTION

1. Field of the Invention

The present invention relates to an emitter coupled logic (ECL) apparatus, and more particularly, to an active pull down (APD) type ECL apparatus.

2. Description of the Related Art

A prior art ECL apparatus includes a current switch formed by an input transistor and a reference transistor, and an emitter follower as an output circuit controlled by a collector voltage of the input transistor. Particularly, when the ECL apparatus is connected to a large connection load capacity, an active pull down circuit is provided and connected to the emitter follower, thereby rapidly and surely changing an output voltage from high to low (see: JP-A-HEI3-106222). In this case, the active pull down circuit is connected to a collector of the reference transistor. This will be explained later in detail.

In the above-mentioned APD type ECL apparatus, however, since a discharging current flowing to the collector of the reference transistor from the active pull down circuit does not sufficiently contribute to the switching of the current switch, the speed of the output voltage from low to high is not rapid.

In order to enhance the speed of the output voltage from low to high, an APD type ECL apparatus, a so-called super push-pull logic (SPL) apparatus, has been known. This will be also explained later in detail.

In the above-mentioned SPL apparatus, however, since a non-threshold logic circuit is provided instead of the current switch, the operation is unstable.

SUMMARY OF THE INVENTION

It is an object of the present invention to provide an APD type ECL apparatus capable of stable operation where effective use is made of a discharging current to contribute to the switching of the current switch.

According to the present invention, in an active pull down ECL apparatus including a current switch formed by an input transistor and a reference transistor, an emitter follower controlled by a collector voltage of the input transistor or the reference transistor, and an active pull down circuit connected to the emitter follower, a resistor is connected to the emitter of the input transistor or the reference transistor. Therefore, when an input voltage is changed so that a voltage at the emitter of the input transistor or the reference transistor is greatly increased, the input transistor or the reference transistor is rapidly turned OFF. Thus, the output voltage is rapidly changed from low to high.

BRIEF DESCRIPTION OF THE DRAWINGS

The present invention will be more clearly understood from the description as set forth below, as compared with the prior art, with reference to the accompanying drawings, wherein:

FIG. 7 is a graph showing gate delay time characteristics of the apparatuses of FIGS. 1 and 4;

DESCRIPTION OF THE PREFERRED EMBODIMENTS

Before the description of the preferred embodiments, prior art APD type ECL apparatuses will be explained with reference to FIGS. 1 and 2.

Figure 1:
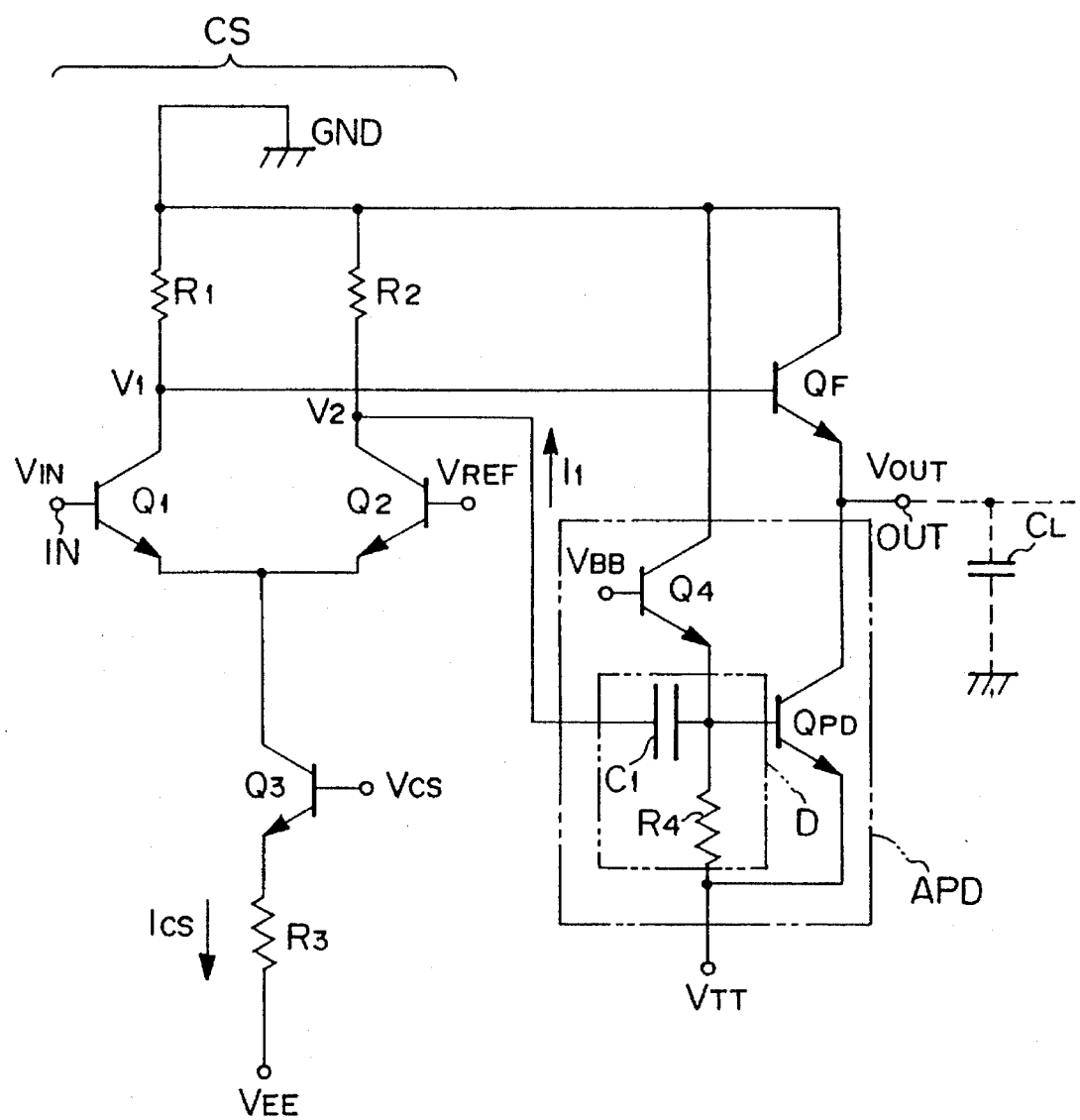
FIGS. 1 is a circuit diagram illustrating a first prior art APD type ECL apparatus.

In FIG. 1, which illustrates a first prior APD type ECL apparatus (see: JP-A-HEI3-106222), reference CS designates a current switch having two output voltages $V_1$ and $V_2$. An emitter follower $Q_F$ is driven by the output voltage $V_1$ of the current switch CS, and an active pull down circuit APD is driven by the output voltage $V_2$ of the current switch CS.

In more detail, the current switch CS includes an input transistor $Q_1$ whose collector is connected via a resistor $R_1$ to a power supply terminal GND, a reference transistor $Q_2$ whose collector is connected via a resistor $R_2$ to the power supply terminal GND, a transistor $Q_3$ whose collector is connected to the emitters of the transistors $Q_1$ and $Q_2$, and a resistor $R_3$. In this case, a constant voltage $V_{CS}$ is applied to the base of the transistor $Q_3$, and therefore, the transistor $Q_3$ and the resistor $R_3$ constitute a constant current source $I_{CS}$. On the other hand, the active pull down circuit APD includes an active pull down transistor $Q_{PD}$, a differential circuit D formed by a capacitor $C_1$ and a resistor $R_4$, and a DC bias transistor $Q_4$. Note that $V_{EE}$ and $V_{TT}$ are power supply terminals at which definite voltages are applied. Also, GND, $V_{EE}$ and $V_{TT}$ indicate voltages applied thereto. Further, a voltage applied to the reference transistor $Q_2$ and a voltage applied to the DC bias transistor $Q_4$ are definite.

In FIG. 1, when a voltage $V_{IN}$ at an input terminal IN is changed from high to low, so as to satisfy $V_{IN}<V_{REF}$, the transistor $Q_1$ is turned OFF and the transistor $Q_2$ is turned ON. As a result, the output voltage $V_1$ of the current switch CS is changed from low to high, and therefore, the emitter follower $Q_F$ charges a connection load having a capacity $C_L$. Thus, an output voltage $V_{OUT}$ rises. In this case, when the output voltage $V_2$ of the current switch CS is changed from high to low, a discharging current as indicated by $I_1$ flows from the capacitor $C_1$ of the differential circuit D, so that the gate of the active pull down transistor $Q_{PD}$ is made low to transiently turn OFF the transistor $Q_{PD}$, to thereby contribute to the rising of the output voltage $V_{OUT}$.

Conversely, in FIG. 1, when the voltage $V_{IN}$ at the input terminal $I_{IN}>V_{REF}$, is changed from low to high, so as to satisfy $V_{IN} > V_{REF}$, the transistor $Q_1$ is turned ON and the transistor $Q_2$ is turned OFF. As a result, the output voltage $V_2$ of the current switch CS is changed from low to high, and therefore, the gate of the active pull down transistor $Q_{PD}$ is made high to transiently turn ON the transistor $Q_{PD}$, to thereby decrease the output voltage $V_{OUT}$.

In the APD type ECL apparatus of FIG. 1, however, when the input signal $V_{IN}$ is changed from high to low, since the current flowing through the reference transistor $Q_2$ is an exponential function of the voltage between the base and emitter thereof, and the turning OFF of the input transistor $Q_1$ and the turning ON of the reference transistor $Q_2$ is carried out after the input voltage $V_{IN}$ becomes lower than the reference voltage $V_{REF}$, the fall of the output voltage $V_2$ is not so rapid. That is, since the discharging operation of the capacitor $C_1$ of the differential circuit D does not contribute to the switching of the current switch CS, the fall of the output signal $V_{OUT}$ at the output terminal OUT is not so rapid.

Figure 2:
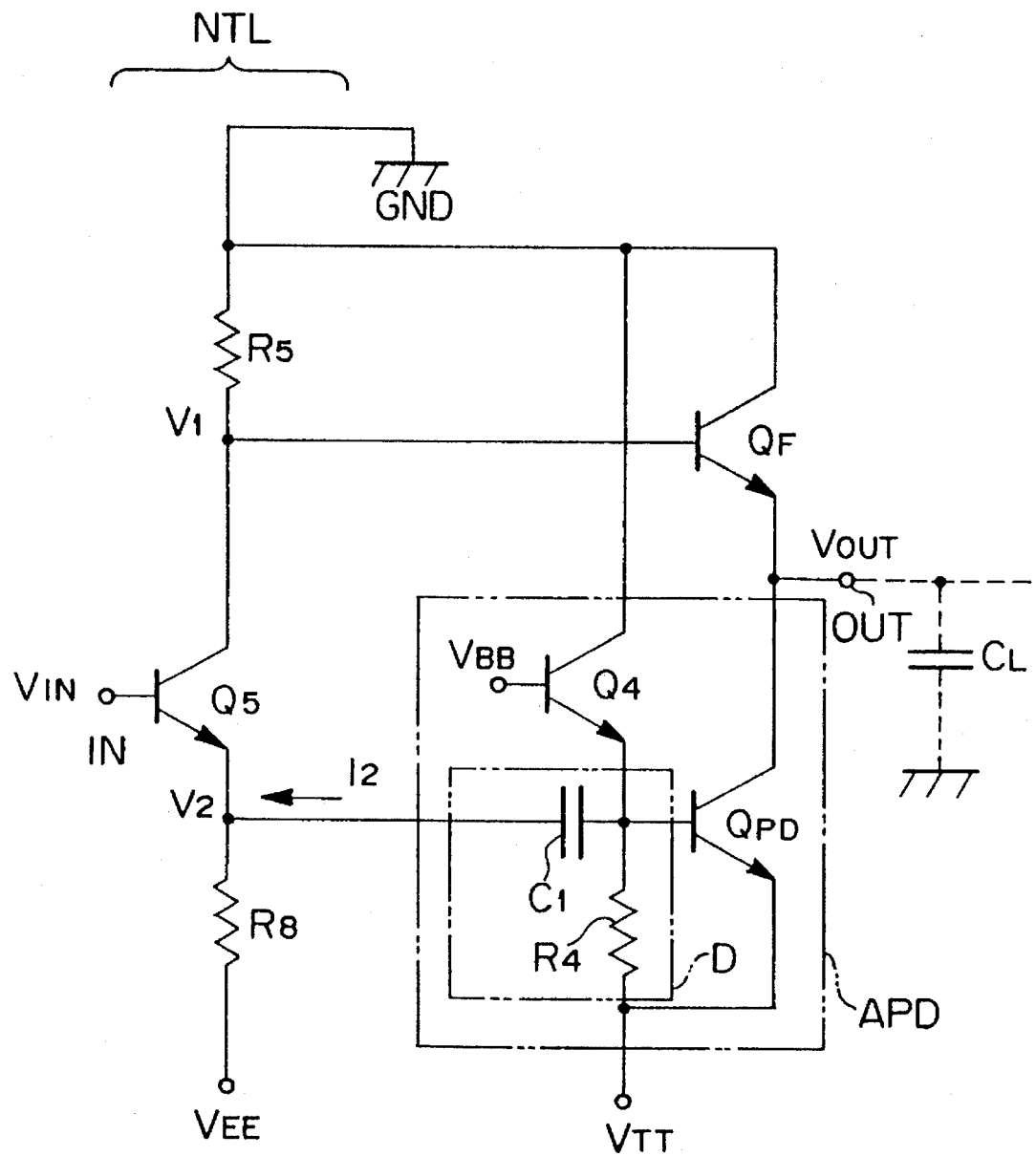
FIG. 2 is a circuit diagram illustrating a second prior art APD type ECL apparatus.

In FIG. 2, which illustrates a second prior art APD type ECL apparatus which is a so-called SPL apparatus, a non-threshold logic circuit NTL is provided instead of the current switch circuit CS of FIG. 1. The non-threshold logic circuit NTL includes a resistor $R_5$, a transistor $Q_5$ and a resistor $R_8$.

In FIG. 2, when the input voltage $V_{IN}$ at the input terminal IN is changed from high to low, the collector voltage $V_1$ of the transistor $Q_5$ is changed from low to high, and therefore, the emitter follower $Q_F$ charges the connection load Paving the capacity $C_L$. Thus, the output voltage $V_{OUT}$ at the output terminal OUT rises. In this case, when the emitter voltage $V_2$ of the transistor $Q_5$ is changed from high to low, a discharging current indicated by $I_2$ flows from the capacitor $C_1$ of the differential circuit D, so that the gate of the active pull down transistor $Q_{PD}$ is made low to transiently turn OFF the transistor $Q_{PD}$, to thereby contribute to the rising of the output voltage $V_{OUT}$.

Conversely, in FIG. 2, when the input voltage $V_{IN}$ at the input terminal IN is changed from low to high, the collector voltage $V_1$ of the transistor $Q_5$ is changed from high to low, and therefore, the gate of the active pull down transistor $Q_{PD}$ is made high to transiently turn ON the transistor $Q_{PD}$, to thereby decrease the output voltage $V_{OUT}$.

In the ATP type ECL apparatus of FIG. 2, when the input signal $V_{IN}$ is changed from high to low, the emitter voltage $V_2$ of the transistor $Q_5$ is rapidly changed from high to low. Therefore, the change from low to high of the output voltage $V_{OUT}$ in FIG. 2 is much more rapid than that in FIG. 1. In the APD type ECL apparatus of FIG. 2, however, since the non-threshold logic circuit NTL has no threshold voltage, the stability of the operation is deteriorated as compared with that of the apparatus of FIG. 1.

Figure 3:
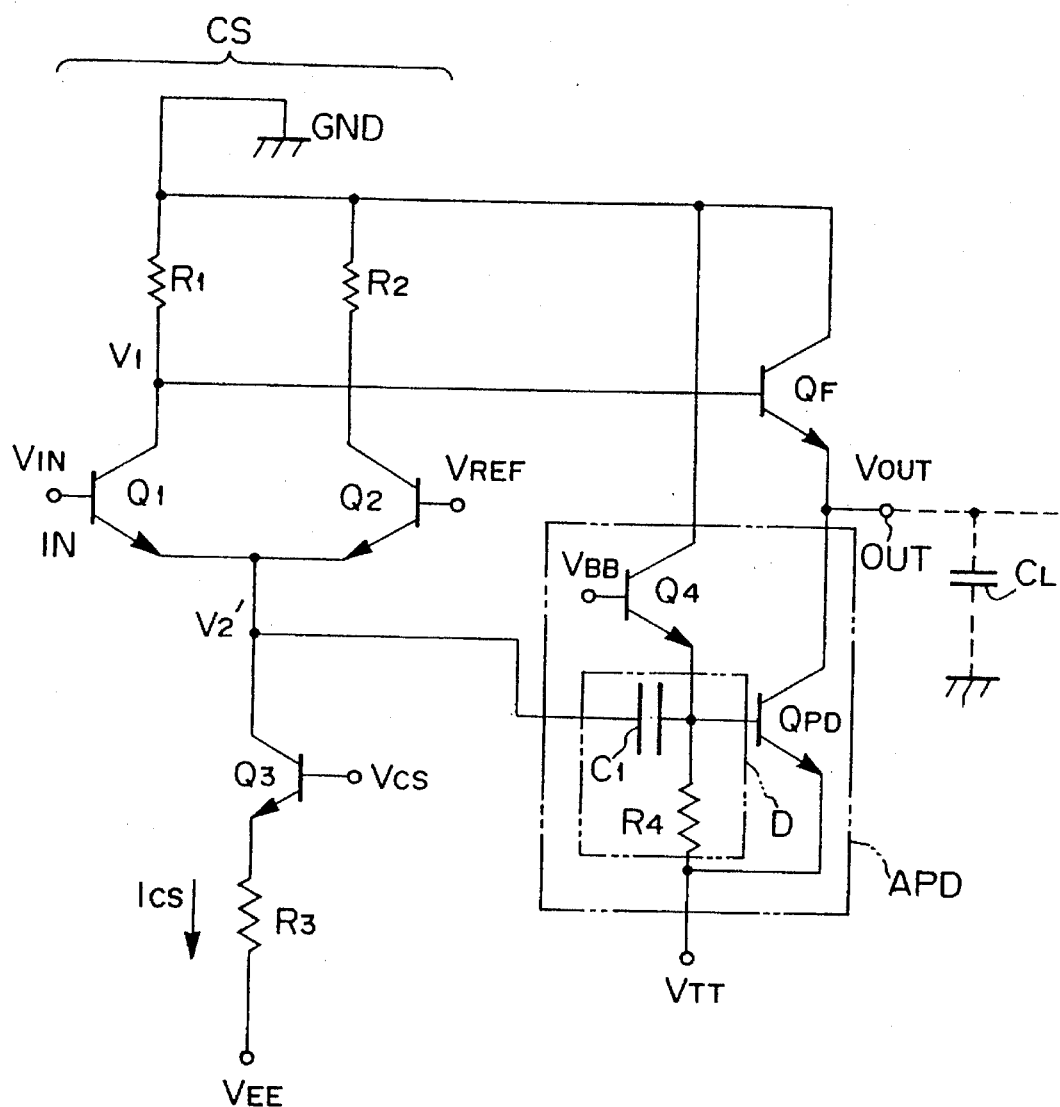
FIG. 3 is a circuit diagram illustrating an APD type ECL apparatus derived simply from the APD type ECL apparatuses of FIGS. 1 and 2.

An APD type ECL apparatus as illustrated in FIG. 3 is suggested by combining the APD type ECL apparatus of FIG. 1 with that of FIG. 2. In FIG. 3, however, the fluctuation of the Collector voltage $V_2'$ of the transistor $Q_3$ is so small that the collector voltage $V_2'$ of the transistor $Q_3$ cannot serve as the emitter voltage $V_2$ of the transistor $Q_2$.

Figure 4:
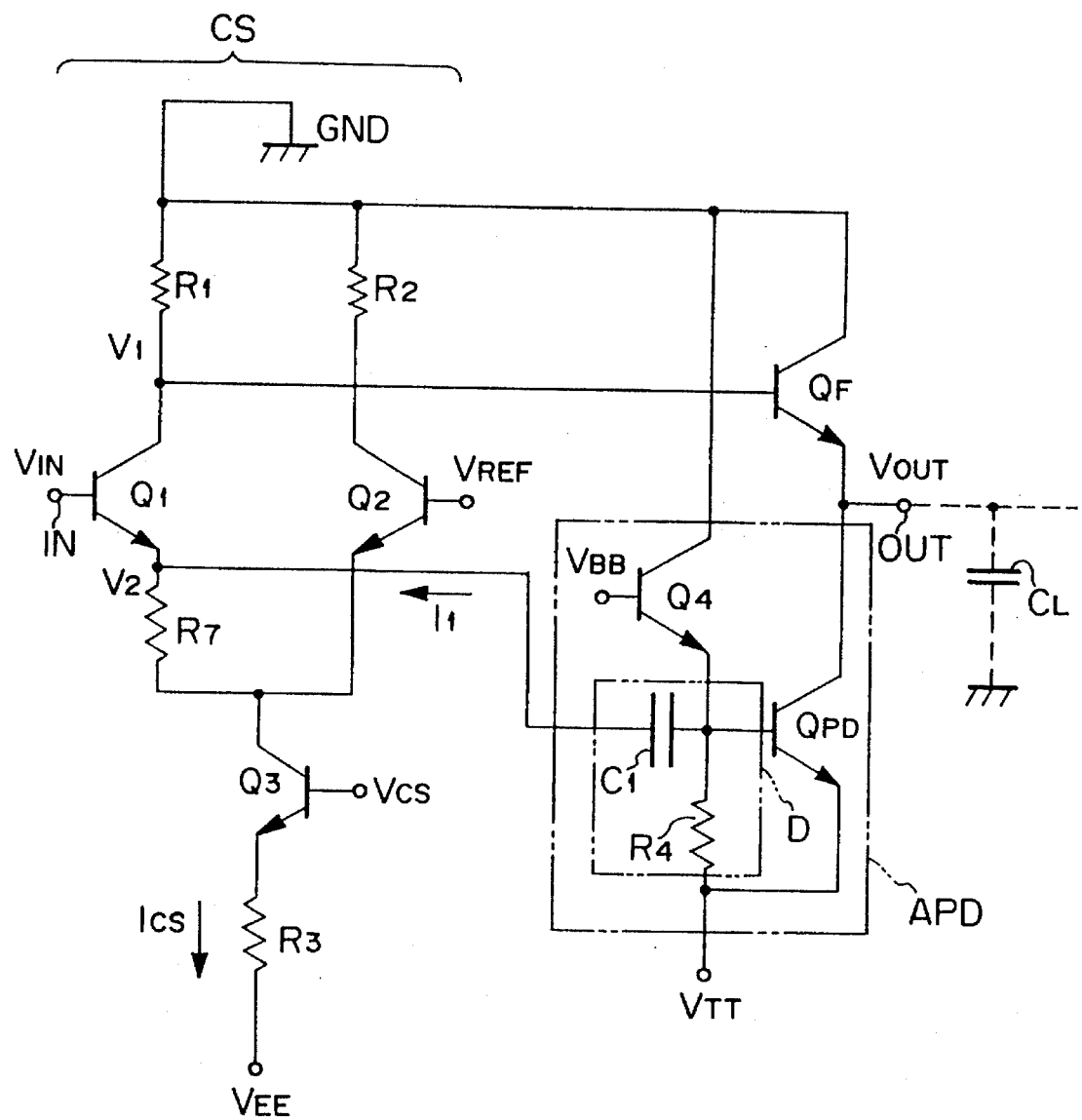
FIG. 4 is a circuit diagram illustrating a first embodiment of the APD type ECL apparatus according to the present invention.

In FIG. 4, which illustrates a first embodiment of the present invention, a resistor $R_7$ is inserted between the emitter of the input transistor $Q_1$ and the collector of the transistor $Q_3$ of FIG. 1. Also, the active pull down circuit APD is connected to the emitter of the input transistor $Q_1$.

In FIG. 4, when the voltage $V_{IN}$ at the input terminal IN is changed from high to low, the collector voltage $V_1$ of the transistor $Q_1$ is changed from low to high, and simultaneously, the emitter voltage $V_2$ of the transistor $Q_1$ is changed from high to low due to the base emitter capacitive coupling thereof. As a result, a discharging current indicated by $I_1$ flows from the capacitor $C_1$ of the differential circuit D, so that the emitter voltage $V_2$ of the transistor $Q_1$ rapidly rises due to the voltage reduction of the resistor $R_7$. Therefore, the base-emitter voltage of the transistor $Q_1$ is reduced to rapidly turn OFF the transistor $Q_1$. Thus, the collector voltage $V_1$ of the transistor $Q_1$ is rapidly increased, and accordingly, the output voltage $V_{OUT}$ is rapidly increased.

Figure 5:
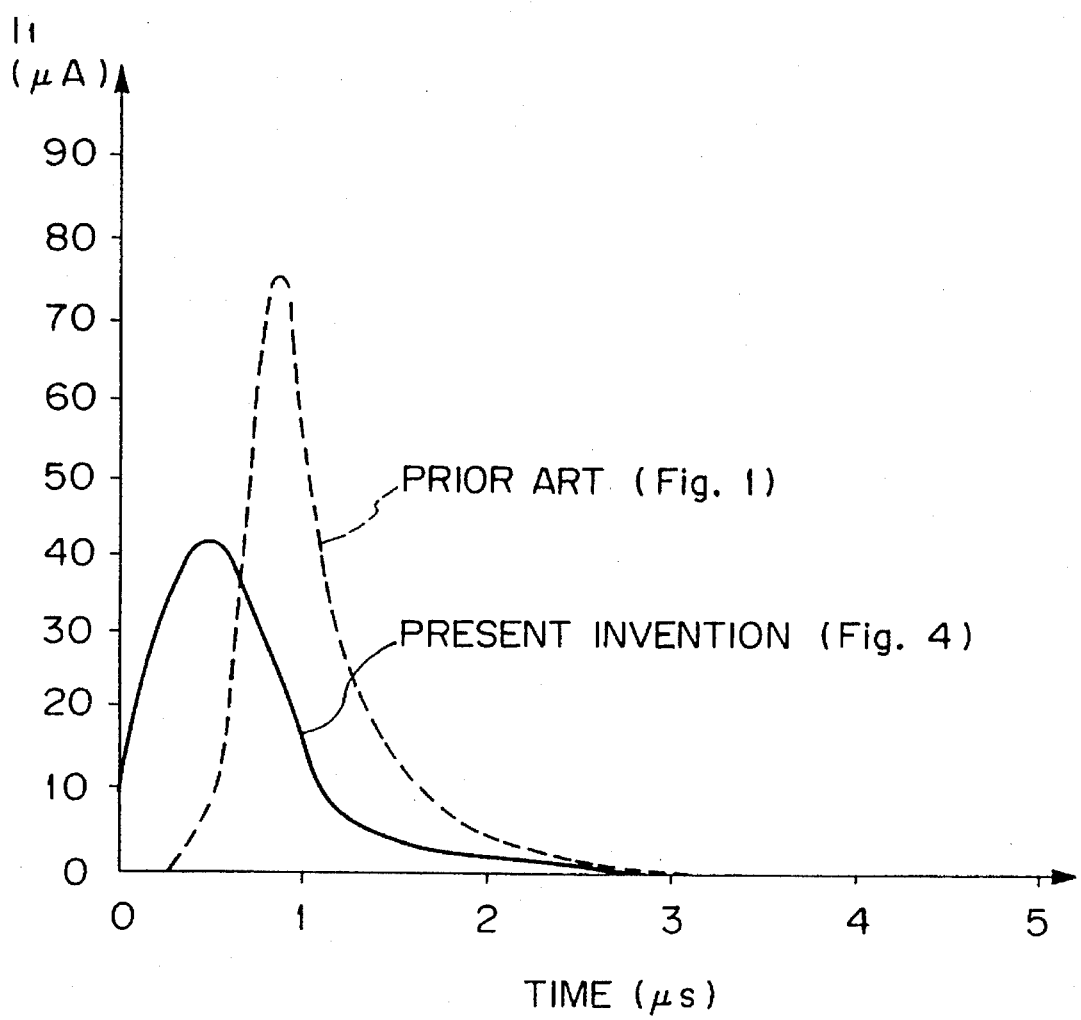
FIG. 5 is a timing diagram showing discharging characteristics of the capacitor of the active pull down circuit of FIGS. 1 and 4.
Figure 6:
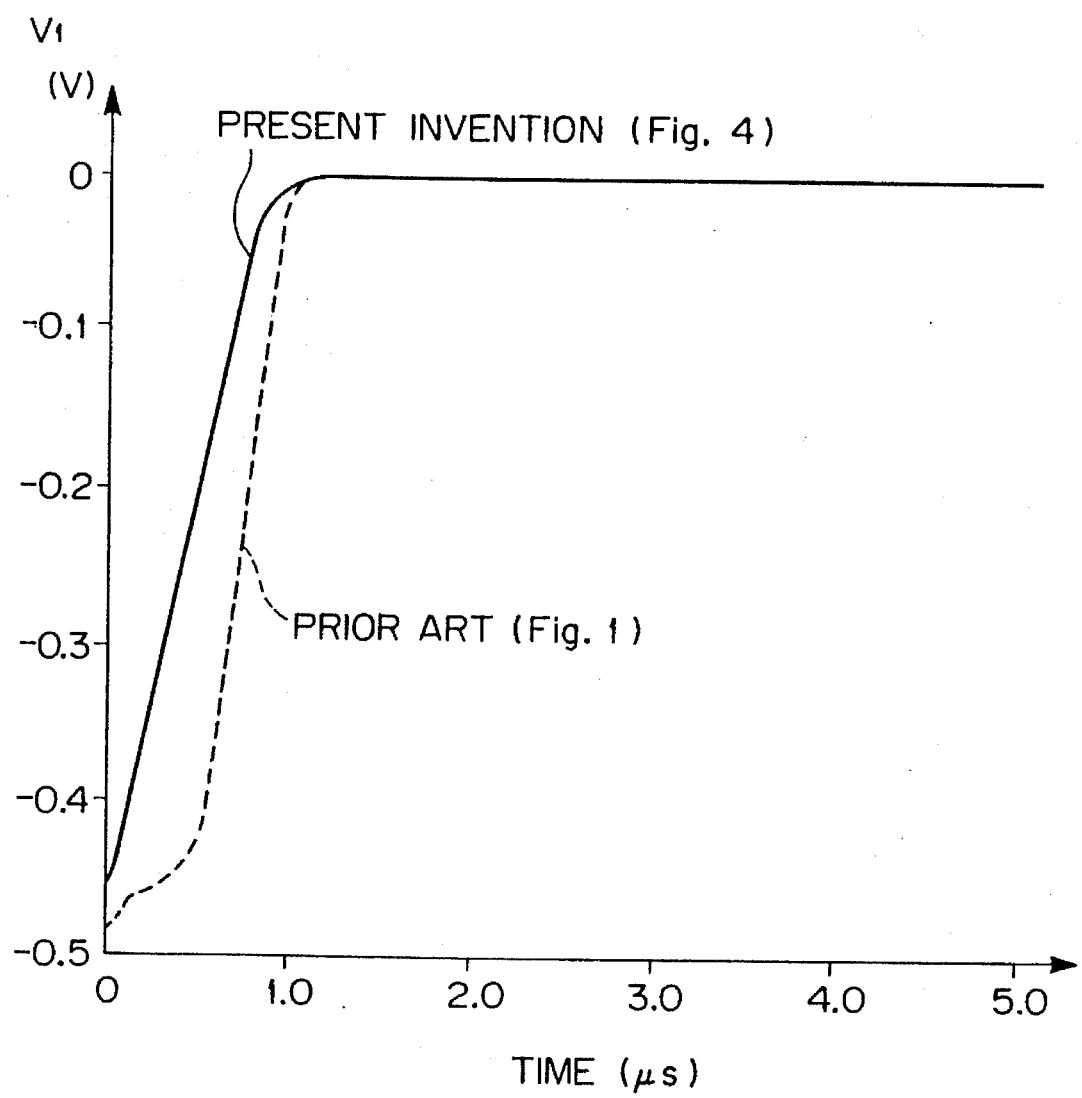
FIG. 6 is a timing diagram showing operation characteristics of the current switch of FIGS. 1 and 4.

FIG. 5 shows the discharging current $I_1$ when the input voltage $V_{IN}$ is changed from high to low, In FIG. 5, a solid line shows the case of FIG. 4, and a dotted line show the case of FIG. 1. That is, the timing of the discharging current $I_1$ in FIG. 4 is earlier that of the discharging current $I_1$ in FIG. 1, and accordingly, the change from low to high of the output voltage $V_{OUT}$ is more rapid in FIG. 4 than in FIG. 1.

Figure 8A:
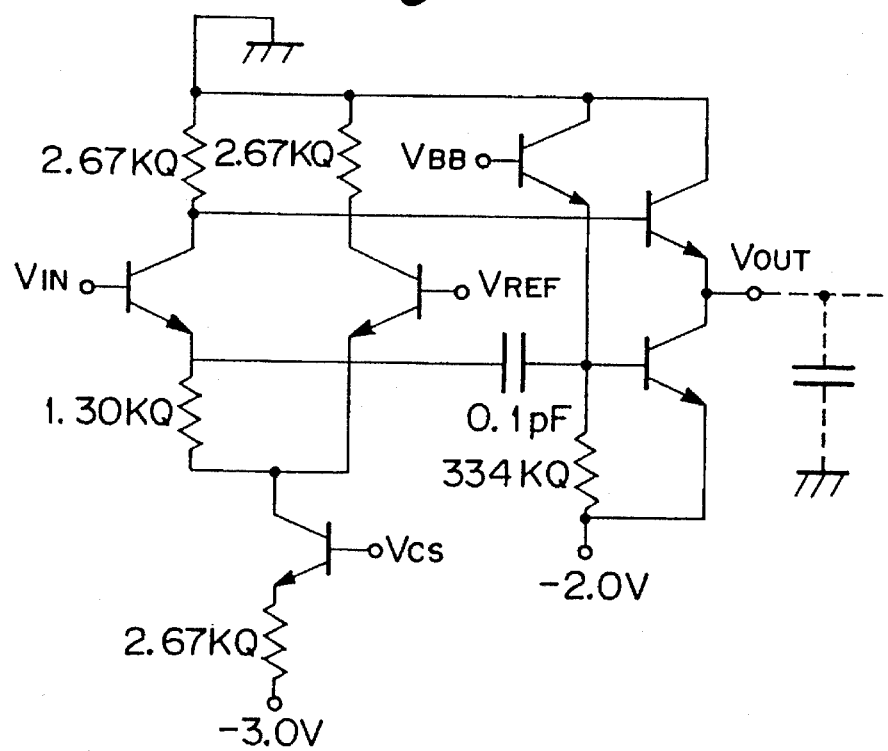
FIG. 8A is a circuit diagram for explaining a simulation condition of the apparatus of FIG. 4.
Figure 8B:
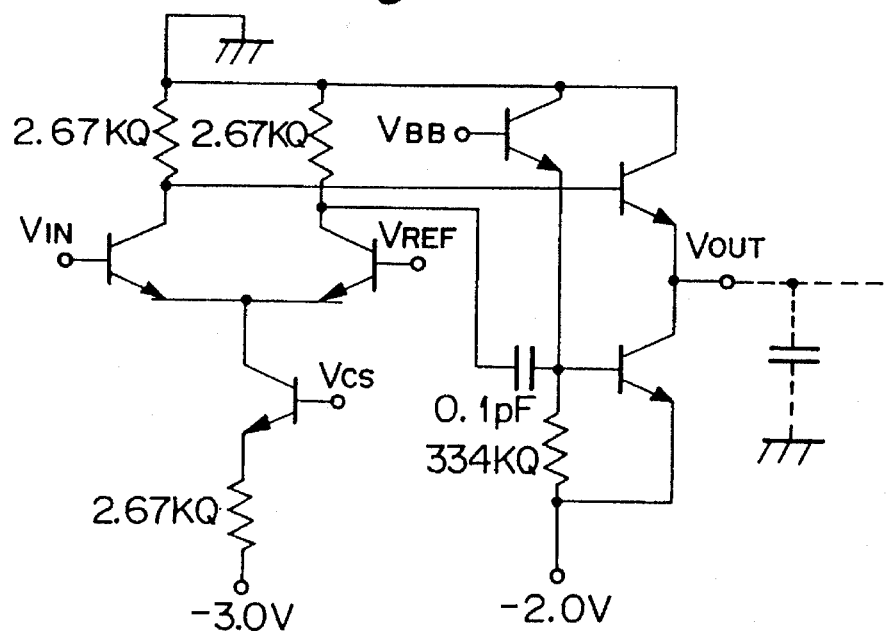
FIG. 8B is a circuit diagram for explaining a simulation condition of the apparatus of FIG. 1.

Also, when the change of the output voltage $V_{OUT}$ from low to high due to the change of the input voltage $V_{IN}$ from high to low is rapid, the gate delay time can be reduced as shown in FIG. 7. In FIG. 7, a solid line shows a simulation result of the circuit of FIG. 4 whose resistors and capacitor are illustrated in FIG. 8A, and a dotted line shows a simulation result in the circuit of FIG. 1 whose resistors and capacitor are illustrated in FIG. 8B. That is, the gate delay time in FIG. 4 is about one third of the gate delay time in FIG. 1.

Figure 9:
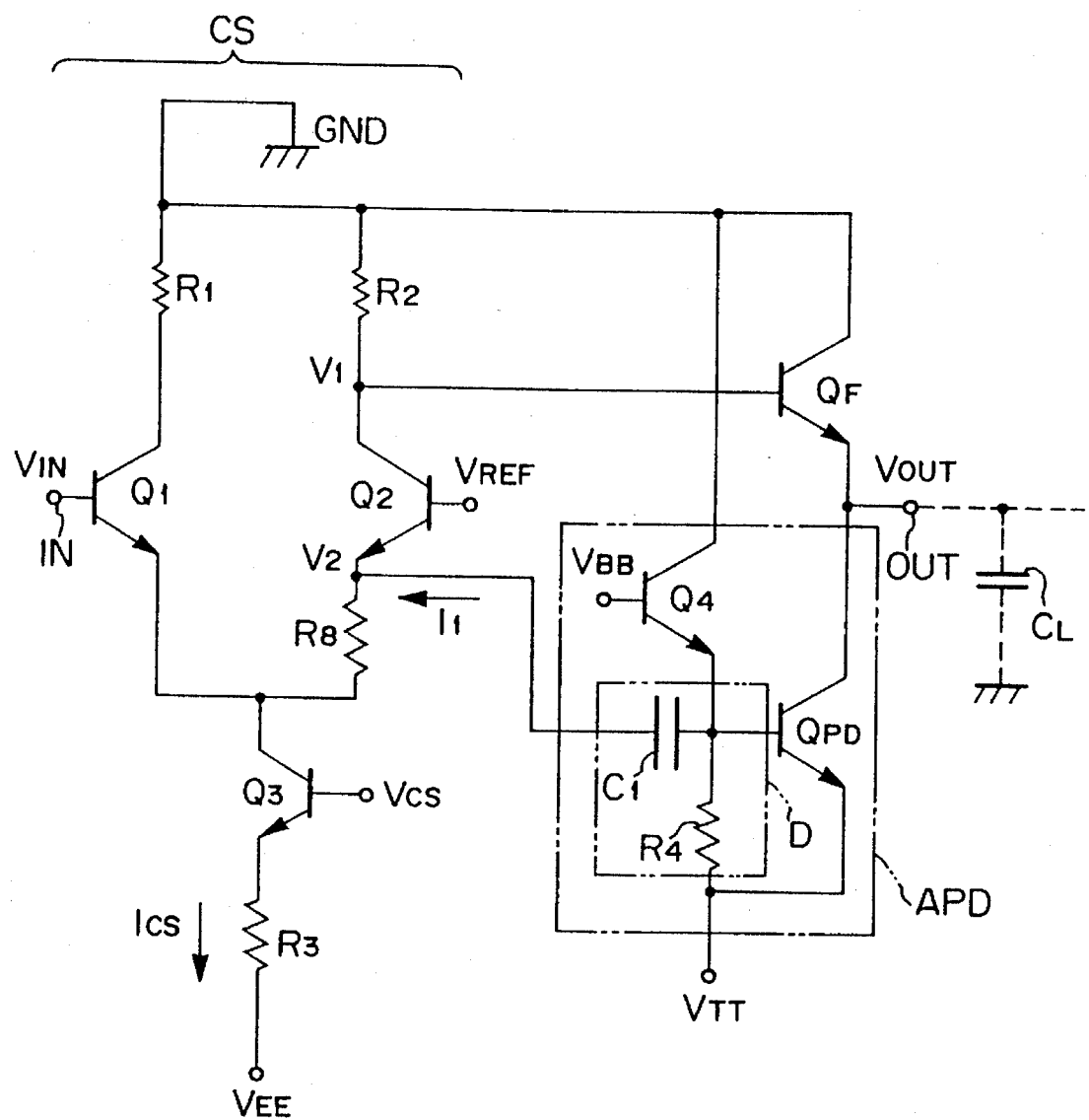
FIG. 9 is a circuit diagram illustrating a second embodiment of the APD type ECL apparatus according to the present invention.

In FIG. 9, which illustrates a second embodiment of the present invention, a resistor $R_8$ is inserted between the emitter of the reference transistor $Q_2$ and the collector of the transistor $Q_3$. Also, the active pull down circuit APD is connected to the emitter of the reference transistor $Q_2$. Further, the emitter follower $Q_F$ is controlled by the collector voltage $V_1$ of the reference transistor $Q_2$.

In FIG. 9, when the input voltage $V_{IN}$, is changed from low to high, this means that the reference voltage $V_{REF}$ is relatively changed from high to low. Therefore, the collector voltage $V_1$ of the transistor $Q_2$ is changed from low to high. Simultaneously, the emitter voltage $V_2$ of the transistor $Q_2$ is changed from high to low. As a result, a discharging current indicated by $I_1$ flows from the capacitor $C_1$ of the differential circuit D, so that the emitter voltage $V_2$ of the transistor $Q_2$ rises rapidly due to the voltage reduction of the resistor $R_8$. Therefore, in this case, the base-emitter voltage of the transistor $Q_2$ is reduced to rapidly turn OFF the transistor $Q_2$. Thus, the collector voltage $V_1$ of the transistor $Q_2$ is rapidly increased and accordingly, the output voltage $V_{OUT}$ is rapidly increased.

Note that, in FIG. 4, the output voltage $V_{OUT}$ is opposite in phase to the input voltage $V_{IN}$, while in FIG. 9, the output voltage $V_{OUT}$ is the same in phase as the input voltage $V_{IN}$.

As explained hereinbefore, according to the present invention, since effective use is made of a discharging current to switching of a current switch, an output voltage can be rapidly changed from low to high. Also, stable operation can be carried out, since the current switch is used without a non-threshold logic circuit.

I claim:

1. An active pull down type ECL apparatus comprising:

a first power supply means;

a second power supply means;

a third power supply means;

an input terminal;

an output terminal;

first and second resistors connected to said first power supply means;

a first transistor having a collector connected to said first resistor and a base connected to said input terminal;

a third resistor connected to an emitter of said first transistor;

a second transistor having a collector connected to said second resistor and a base for receiving a reference voltage;

a constant current source connected to said third resistor and the emitter of said second transistor, and to second power supply means;

an emitter follower connected between said first power supply means and said output terminal and controlled by a voltage at the collector of said first transistor;

a differential circuit connected to the emitter of said first transistor; and an active pull down transistor connected between said output terminal and said third power supply means and controlled by an output signal of said differential circuit.

2. An apparatus as set forth in claim 1, wherein said constant current source comprises:

a third transistor having a collector connected to said third resistor and the emitter of said second transistor and a base for receiving a constant voltage; and a fourth resistor connected between an emitter of said third transistor and said second power supply means.

3. An apparatus as set forth in claim 1, wherein said differential circuit comprises:

a capacitor connected between the emitter of said first transistor and a base of said active pull down transistor; and a fifth resistor connected between the base of said active pull down resistor and said third power supply means, said fifth resistor being connected via a resistor means to said first power supply means.

4. An active pull down type ECL apparatus comprising:

a first power supply means;

a second power supply means;

a third power supply means;

an input terminal;

an output terminal;

first and second resistors connected to said first power supply means;

a first transistor having a collector connected to said first resistor and a base connected to said input terminal;

a second transistor having a collector connected to said second resistor and a base for receiving a reference voltage;

a third resistor connected to an emitter of said second transistor;

a constant current source connected to the emitter of said first transistor and said third resistor, and to second power supply means;

an emitter follower connected between said first power supply means and said output terminal and controlled by a voltage at the collector of said second transistor;

a differential circuit connected to the emitter of said second transistor; and an active pull down transistor connected between said output terminal and said third power supply means and controlled by an output signal of said differential circuit.

5. An apparatus as set forth in claim 4, wherein said constant current source comprises:

a third transistor having a collector connected to said third resistor and the emitter of said first transistor and a base for receiving a constant voltage; and a fourth resistor connected between an emitter of said third transistor and said second power supply means.

6. An apparatus as set forth in claim 4, wherein said differential circuit comprises:

a capacitor connected between the emitter of said second transistor and a base of said active pull down transistor; and a fifth resistor connected between the base of said active pull down resistor and said third power supply means, said fifth resistor being connected via a resistor means to said first power supply means.

7. An active pull down type ECL apparatus comprising:

a current switch including an input transistor controlled by an input voltage, a reference transistor controlled by a reference voltage, and a constant current source connected to said input transistor and said reference transistor;

an emitter follower connected between a first power supply terminal and an output terminal and controlled by a voltage at a collector of said input transistor;

an active pull down circuit connected between said output terminal and a second power supply terminal and controlled by a voltage at an emitter of said input transistor; and a resistor connected between the emitter of said input transistor and said constant current source.

8. An apparatus as set forth in claim 7, wherein said active pull down circuit comprises:

an active pull down transistor connected between said output terminal and said second power supply terminal;

a first load connected between said first power supply terminal and a base of said active pull down transistor;

a second load connected between the base of said active pull down transistor and said second power supply terminal; and a capacitor connected between the emitter of said input transistor and the base of said active pull down transistor.

9. An active pull down type ECL apparatus comprising:

a current switch including an input transistor controlled by an input voltage, a reference transistor controlled by a reference voltage, and a constant current source connected to said input transistor and said reference transistor;

an emitter follower connected between a first power supply terminal and an output terminal and controlled by a voltage at a collector of said reference transistor;

an active pull down circuit connected between said output terminal and a second power supply terminal and controlled by a voltage at an emitter of said reference transistor; and a resistor connected between the emitter of said reference transistor and said constant current source.

10. An apparatus as set forth in claim 9, wherein said active pull down circuit comprises:

an active pull down transistor connected between said output terminal and said second power supply terminal;

a first load connected between said first power supply terminal and a base of said active pull down transistor;

a second load connected between the base of said active pull down transistor and said second power supply terminal; and a capacitor connected between the emitter of said reference transistor and the base of said active pull down transistor.

* * * * *